United States Patent
Dvir et al.

(10) Patent No.: US 6,368,182 B2
(45) Date of Patent: *Apr. 9, 2002

(54) APPARATUS FOR OPTICAL INSPECTION OF WAFERS DURING POLISHING

(75) Inventors: Eran Dvir, Givatayim; Moshe Finarov, Rehovoth, both of (IL); Eli Haimovich, Cupertino, CA (US); Benjamin Shulman, Rehovoth; Rony Abaron, Raanana, both of (IL)

(73) Assignee: Nova Measuring Instruments Ltd., Rehovot (IL)

( * ) Notice: Subject to any disclaimer, the term of this patent is extended or adjusted under 35 U.S.C. 154(b) by 0 days.

This patent is subject to a terminal disclaimer.

(21) Appl. No.: 09/876,948

(22) Filed: Jun. 11, 2001

Related U.S. Application Data

(63) Continuation-in-part of application No. 09/498,926, filed on Feb. 4, 2000, now abandoned.

(51) Int. Cl.[7] ................................................ B24B 49/00
(52) U.S. Cl. .......................... 451/6; 451/287; 356/503; 356/630; 356/908
(58) Field of Search ..................... 451/6, 7, 41, 285, 451/287, 288; 356/300, 302, 326, 451, 456, 452, 503, 510, 630, 908

(56) References Cited

U.S. PATENT DOCUMENTS

| | | | | |
|---|---|---|---|---|
| 5,433,651 A | * | 7/1995 | Lustig et al. | 451/6 |
| 5,492,594 A | * | 2/1996 | Burke et al. | 451/286 |
| 5,730,642 A | * | 3/1998 | Sandhu et al. | 451/6 |
| 6,045,433 A | * | 4/2000 | Dvir et al. | 451/6 |
| 6,110,011 A | * | 8/2000 | Somekh et al. | 451/288 |

* cited by examiner

Primary Examiner—Eileen P. Morgan
(74) Attorney, Agent, or Firm—Dekel Patent Ltd.; David Klein

(57) ABSTRACT

A monitoring tool for monitoring an article in a wet environment, the monitoring tool including a monitoring station having an optical unit, a liquid holding unit for receiving the article, and a window, through which at least a portion of the article is viewable by the optical unit, a buffer station associated with the monitoring station having a plurality of supporting assemblies for receiving the article before and after being monitored, wherein at least one of the supporting assemblies includes a liquid receptacle for holding the article therein, and a gripping unit operating in conjunction with the monitoring station for moving the article from the buffer station to the liquid holding unit of the monitoring station.

23 Claims, 13 Drawing Sheets

APPARATUS FOR OPTICAL INSPECTION OF WAFERS DURING POLISHING

RELATED APPLICATIONS

This is a continuation-in-part of U.S. patent application Ser. No. 09/498,926, filed Feb. 4, 2000, now abandoned.

FIELD OF THE INVENTION

The present invention relates to wafer polishing apparatus in general and to measuring systems incorporated into such apparatus in particular.

BACKGROUND OF THE INVENTION

Wafer polishing systems are known in the art. They polish the top layer of semiconductor wafers to a desired thickness. To do so, the wafer being polished is immersed in a slurry of water and chemicals during the polishing process. Once the wafer has been polished and washed down, it is placed into an exit station known by some companies as a "water track", after which the wafer is placed into a cassette of wafers. The cassette is maintained within a water bath until full, after which the entire cassette is brought to a cleaning station to remove any chemicals and slurry particles still remaining on the wafers in the cassette and to dry the wafers. After cleaning, the wafers are brought to a measurement station to determine if the polisher produced the desired thickness of their top layers.

FIG. 1, to which reference is now briefly made, illustrates a prior art water track, such as the water track of the #372 Polisher manufactured by IPEC Westech Inc. of Phoenix, Ariz., USA. The water track, labeled 10, comprises a frame 12 and a base 14. Frame 12 has jet holes 16 connected to jets (not shown) which emit streams 18 of water through holes 16. Base 14 has holes 20 connected to bubblers (not shown) which bubble small amounts of water 22 through holes 20. When a wafer 25 is dropped into water track 10, pattern-side down, the jets and bubblers are activated. Streams 18, from the water jets, serve to force the wafer 25 in the direction indicated by arrow 24. Small streams 22 push the wafer 25 slightly away from the base 14 and ensure that, while the wafer 25 moves through the track, it never rubs against base 14 and thus, the pattern on the wafer is not scratched.

Other companies produce polishers whose exit stations are formed just of the cassettes. Such a polisher is produced found in the 6DS-SP polisher of R. Howard Strasbaugh Inc. San Luis Obispo, Calif., USA.

SUMMARY OF THE INVENTION

It is an object of the present invention to provide a measurement system installable within a polishing machine and, more specifically, within the exit station of a polishing machine.

In accordance with a preferred embodiment of the present invention, the present invention includes an optical system, which views the wafer through a window in the exit station, and a gripping system, which places the wafer in a predetermined viewing location within the exit station while maintaining the patterned surface completely under water. The present invention also includes a pull-down unit for pulling the measurement system slightly below the horizontal prior to the measurement and returns the measuring system to horizontal afterwards.

In accordance with a first preferred embodiment of the present invention, the gripping system includes a raisable gate which collects the wafer in a predetermined location, and a gripper which grips the wafer, carries it to the viewing location and immerses the wafer, along a small angle to the horizontal, in the water or water. The gripper also holds the wafer in place during the measurement operation, after which, it releases the wafer and the raisable gate is raised.

The present invention incorporates the method of immersing an object into water such that very few bubbles are produced on the wafer surface. The method of the present invention preferably includes the step of immersing the object while it is held such that its surface plane is at a small angle to the horizontal.

In a second embodiment, the measurement system includes a water bath and a gripping system thereabove. The gripping system includes wafer holding elements, which receive the wafer, and a gripper whose initial location is above the expected reception location of the wafer. The gripper is flexibly connected at an angle to a piston such that the wafer is immersed in the water at an angle to the horizontal.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
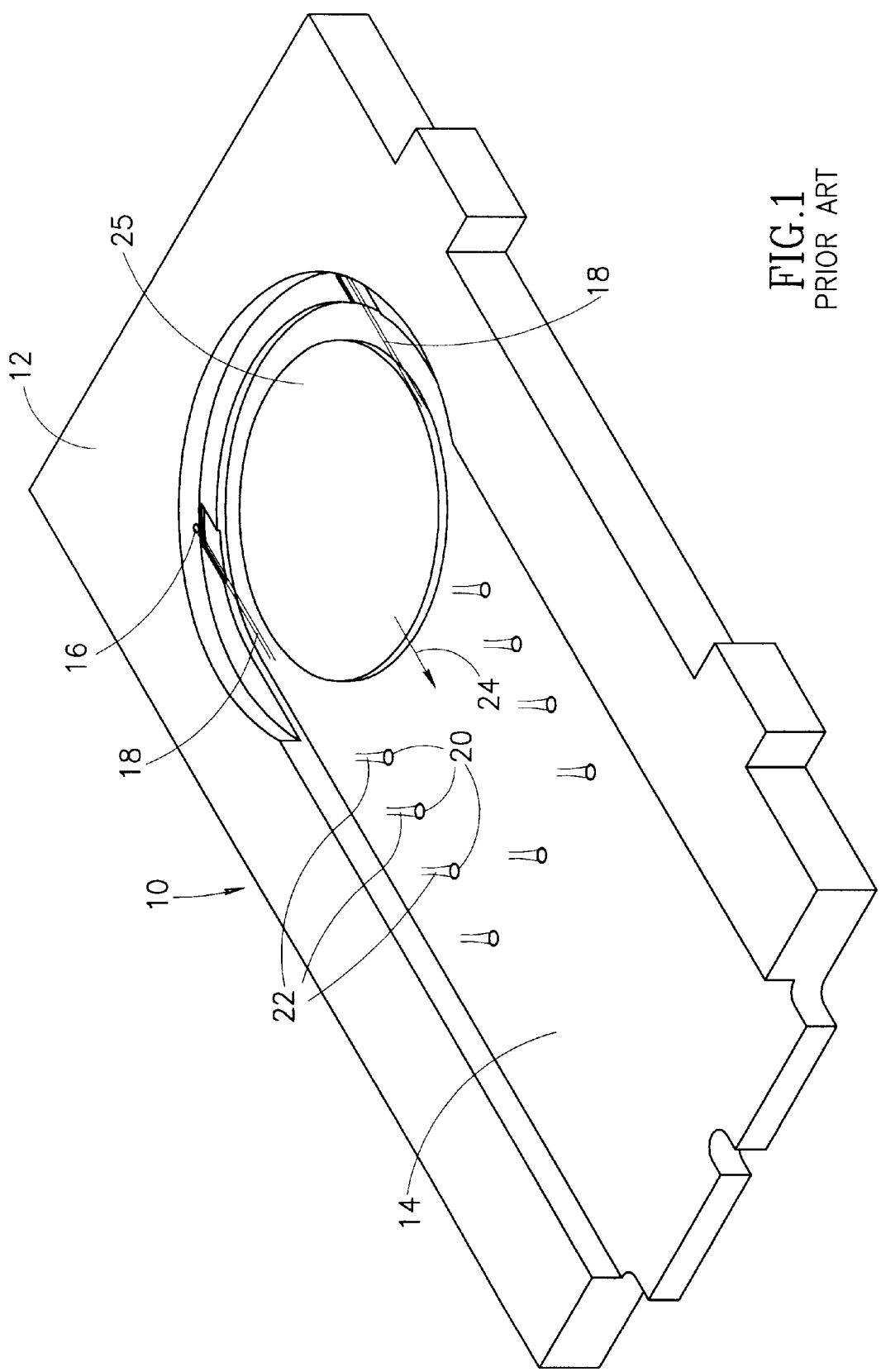
FIG. 1 is a schematic illustration of a prior art water track.
Figure 2:
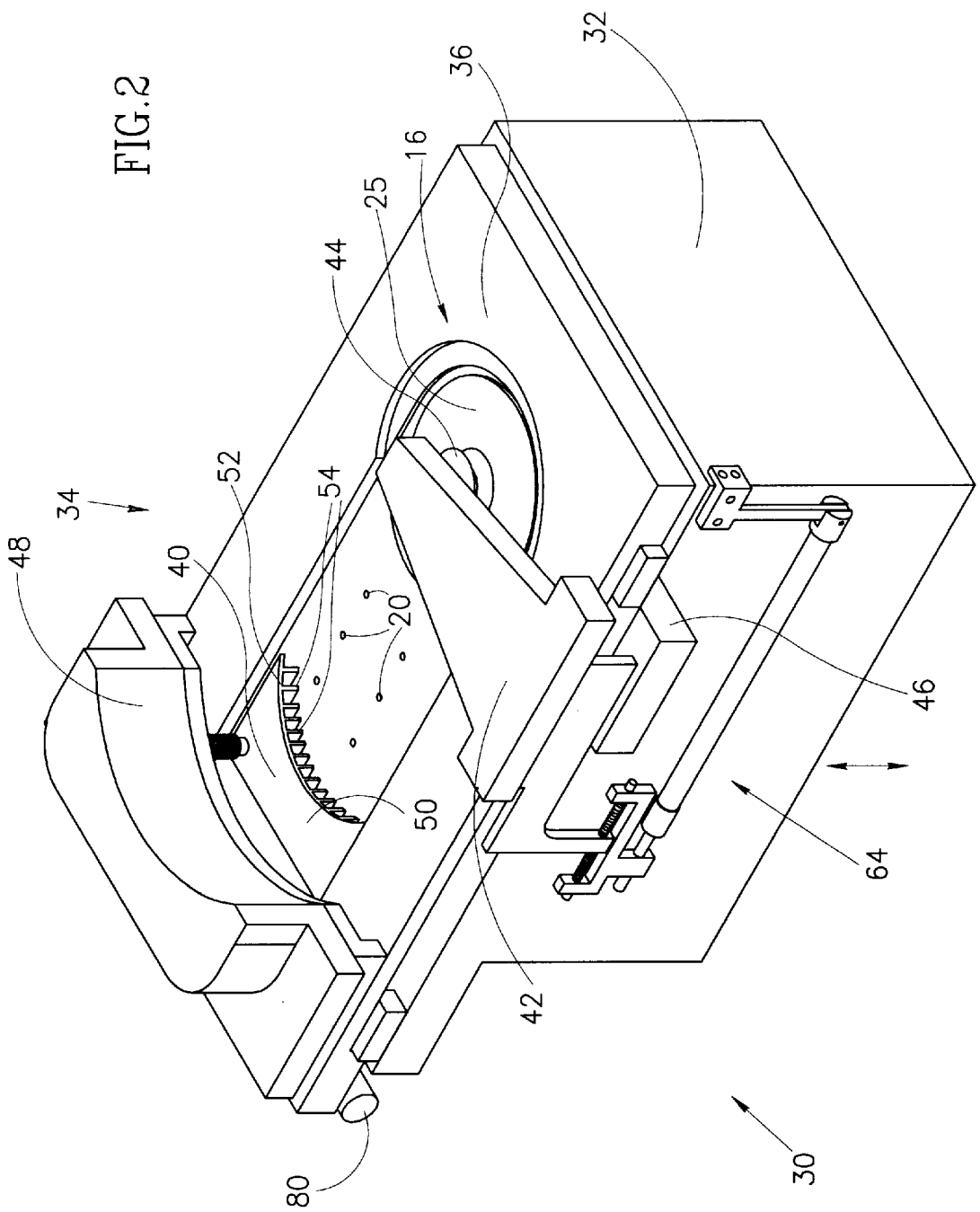
FIG. 2 is a schematic illustration of a measurement system installable within a polishing machine, the measurement system being constructed and operative in accordance with a preferred embodiment of the present invention.

Reference is now made to FIG. 2, which illustrates a measurement unit installable within a polishing machine, such as the IPEC Westech machine, the measurement system being constructed and operative in accordance with a preferred embodiment of the present invention and to FIGS. 3, 4, 5, 6, 7 and 8 which illustrate the operation of a gripping system forming part of the measurement system of FIG. 2. Similar reference numerals are utilized to refer to elements of the water track previously discussed.

Figure 9:
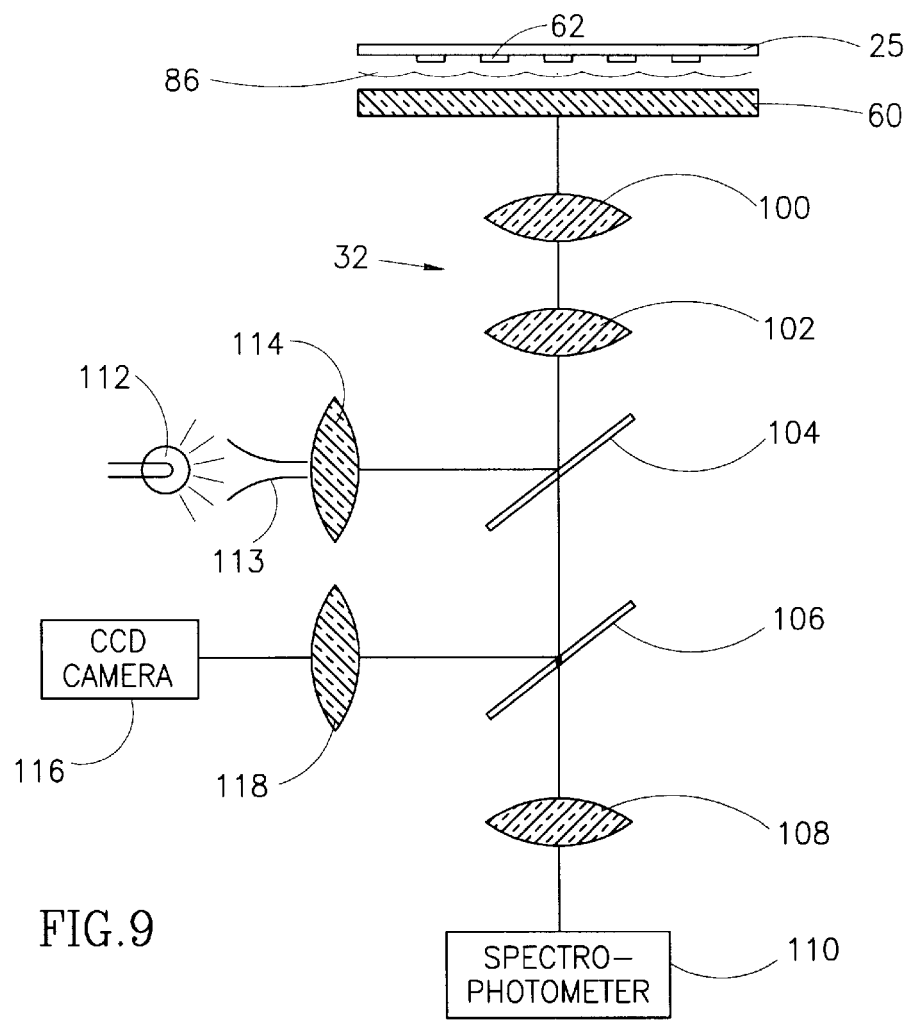
FIG. 9 is a schematic illustration of an example optical system forming part of the measurement system of the present invention.

The measurement system, labeled 30, comprises an optical system 32 and a gripping system 34 operative in conjunction with a water track 36. The optical system 32 can be any optical system which measures the thickness of the top layer of the wafer through water. FIG. 9 provides one example of such a optical system; other optical systems are also incorporated into the present invention.

The gripping system 34 comprises a raisable gate 40, a translatable gripper 42, a vacuum pad 44 and a vacuum system 46. Gate 40 is controlled by a lifting mechanism 48 which raises and lowers gate 40 as necessary. Gate 40 has an upper surface 50 with a curved outer edge 52 and a plurality of protrusions 54 extending downward into the water from the upper surface 50. Protrusions 54 provide a lower surface onto which the gate 40 is lowered while enabling the water to pass through the gate 40. Curved edge 52 is shaped to match the curved edge of the wafer 25 so that, when gate 40 is in its lowered position, gate 40 will both keep the wafer 25 from passing out of the water track and to hold the wafer 25 in a repeatable location.

Gripper 42 translates between the wafer collecting position defined by the curved edge 52 and a wafer measuring location indicated in FIG. 2 by the wafer 25. Although not visible in FIG. 2, the base of the water track at the wafer measuring location has been replaced by a window 60 (FIGS. 3–9) to enable the optical system 32 to view the patterned surface 62 of the wafer 25. For the purposes of the explanation, the patterned surface 62 is shown exaggeratedly in the Figures.

Gripper 42 can be translated by any translation system; an example of one such system is provided in FIG. 2 and labeled 64.

The vacuum pad 44 is typically a bellows-shaped pad and is mounted at the end of the gripper 42 and is connected to the vacuum system 46. The vacuum pad 44 creates a suction so that gripper 49 can raise the wafer 25 and move it from the wafer collecting position to the wafer measuring location. In addition, the vacuum is maintained during the measurement and only released once the measurement is complete.

Figure 3:
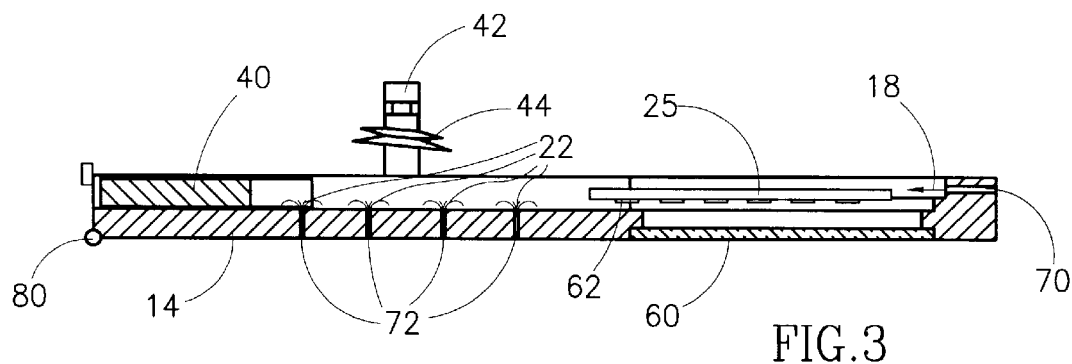
FIGS. 3, 4, 5, 6, 7 and 8 are schematic, side view illustrations of a gripping system forming part of the measurement system of FIG. 2 in various stages of operation.

FIGS. 3–8 illustrate the operation of the gripping system 34. Initially, and as shown in FIG. 3. the jets, labeled 70, and the bubblers, labeled 72, of the water track are operated and the gate 40 is lowered. The polisher (not shown) places the wafer 25 within the water track and the streams 16 from the jets 70 push the wafer 25 towards the gate 40. The gripper 42 is at the wafer collecting position, shown to the left in FIGS. 3–8.

Figure 4:
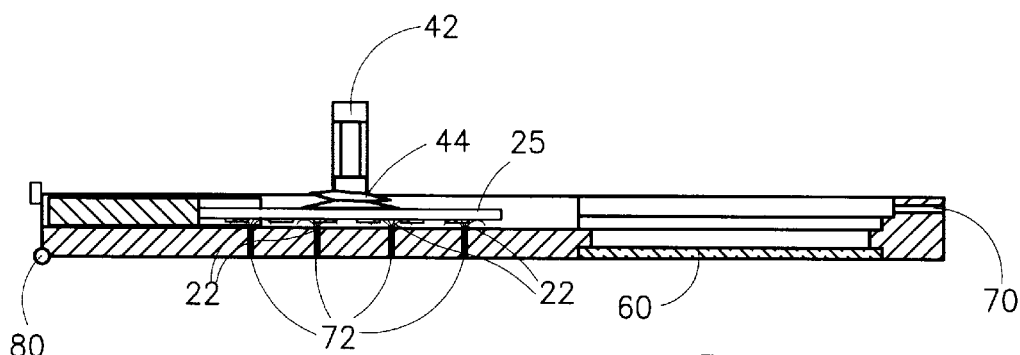
Figure 5:
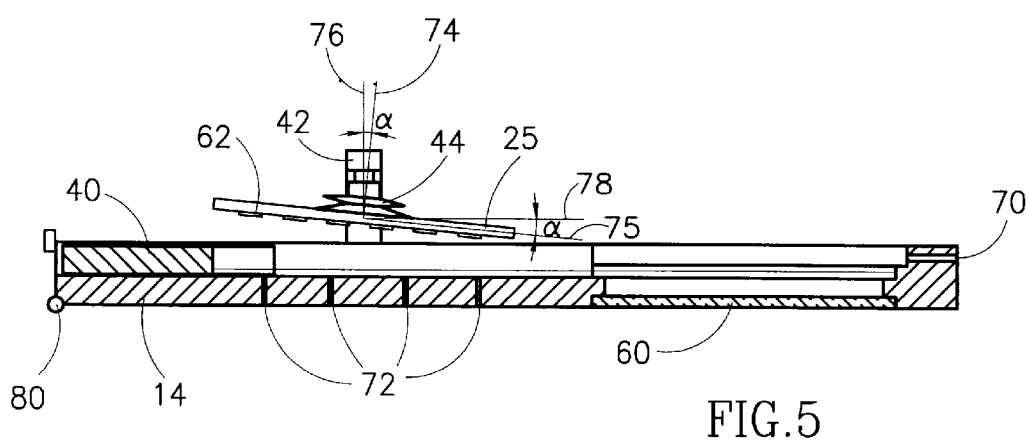

Once the wafer 25 is in the wafer collecting position, as shown in FIG. 4, gripper 42 lowers vacuum pad 44 to grab the wafer 25. It will be appreciated that gripper 42 can be formed of any suitable mechanism, such as a piston, which can move vacuum pad 44 up and down on command. Since bubblers 72 are operating, the small streams 22 maintain the wafer 25 away from the base 14 of the water track.

The gripper 42 then pulls the wafer 25 out of the water (FIG. 5) and the jets 70 are deactivated. In accordance with a preferred embodiment of the present invention, the axis 74 of symmetry of the vacuum pad 44 is formed at a small angle $\alpha$ from the vertical axis 76. As a result, a long axis 75 of the wafer 25 is at the same small angle $\alpha$ to the horizontal axis 78. Angle $\alpha$ is typically in the range of 2–5°.

Figure 6:
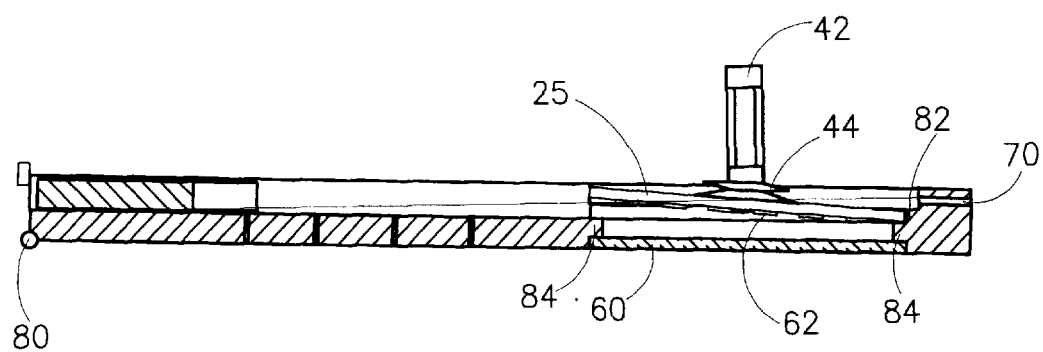
Figure 7:
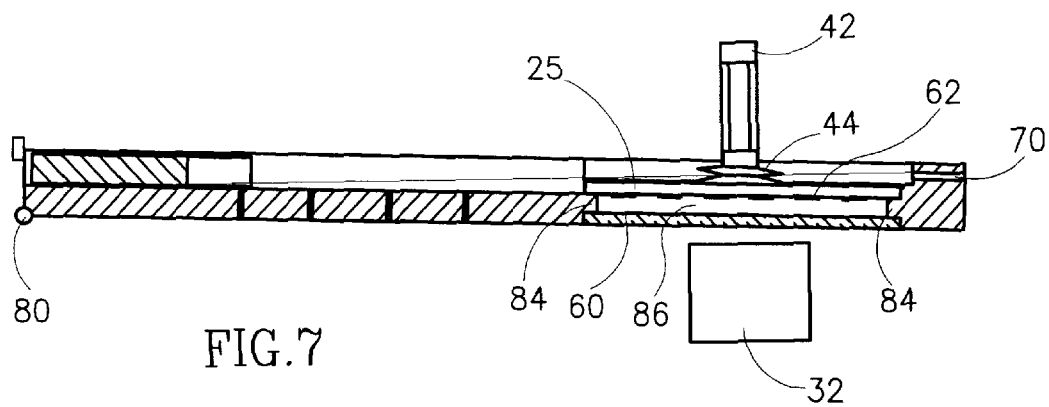
Figure 8:
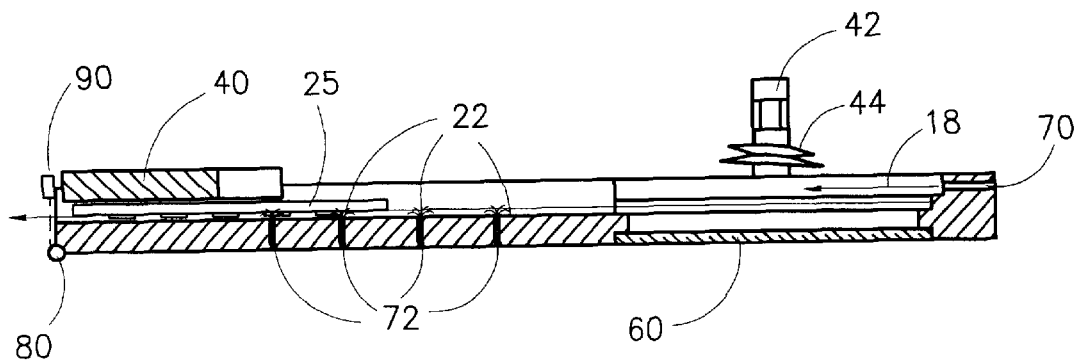

Translation unit 64 then moves gripper 42 to the wafer measuring position, shown to the right in FIGS. 4–8. At the same time and as shown in FIG. 6, a pull-down mechanism slightly lowers the entire water track, gripping and optical system unit (at an angle of 1–3°), about a hinge 80 (FIGS. 2–8), to force the wafer toward the wafer measuring position. Other methods of forcing the water towards the measuring position are also incorporated in the present invention.

After the lowering of the water track, gripper 42 lowers the wafer 25 towards the window 60. Since the vacuum pad 44 is angled, the wafer 25 does not enter the water all at once. Instead, wafer 25 enters the water gradually. Initially, only the side labeled 82 is immersed. As the gripper 42 pushes the vacuum pad 44 further down, more and more of the wafer 25 becomes immersed until the entire wafer 25 is within the water. Vacuum pad 44 is flexible enough to accommodate the changed angle of wafer 25.

It will be appreciated that, by gradually immersing the wafer in the water, few, if any, bubbles are created near the patterned surface of the wafer 25.

It is noted that the wafer 25 does not rest against the window 60. Instead, it is held against protruding surfaces 84 such that there is a layer of water 86 between the wafer 25 and window 60. Due to the gradual immersion of wafer 25, layer 86 of water has little, if any, bubbles in it and therefore provides a uniform connecting medium between the optical system 32 and the patterned surface 62 of wafer 25.

Once the optical system 32 has finished measuring the patterned surface 62 of wafer 25, gripper 42 returns vacuum pad 44, with wafer 25 still attached, to its upper position. The pull-down mechanism rotates the water track about hinge 80 to return to its original position, gate 40 is raised, and jets 70 and bubblers 72 are activated. The vacuum system 46 releases the vacuum and the wafers 25 fall into the water track. The flow of water causes the wafer 25 to move toward and under the now raised gate 40. A sensor 90 determines when the wafer 25 successfully passes out of the water track. The process described hereinabove can now begin for the next wafer.

Reference is now made to FIG. 9 which schematically illustrates an example of a suitable optical system 32. Optical system 32 is a microscope-based spectrophotometer and comprises an objective lens 100, a focusing lens 102, a beam splitter 104, a pinhole mirror 106, a relay lens 108 and a spectrophotometer 110. It additionally comprises a light source 112, a condenser 114, a charge coupled device (CCD) camera 116 and a second relay lens 118.

Light from light source 112 is provided, along an optical fiber 113, to condenser 114. In turn, condenser 114 directs the light towards beam splitter 104. Beam splitter 104 directs the light towards the wafer surface via lenses 102 and 100 and via window 60 and water layer 86.

The reflected light from the patterned surface 62 is collected by objective 100 and focused, by lens 102, onto pinhole mirror 106. Relay lens 108 receives the light passed through pinhole mirror 106 and focuses it onto the spectrophotometer 110.

Pinhole mirror 106 passes light through its hole towards spectrophotometer 110 and directs the light hitting the mirror surface towards CCD camera 114. Second relay lens 118 receives the light reflected by pinhole mirror 106 and focuses it onto the CCD camera 114.

Since the pinhole is placed at the center of the image plane which is the focal plane of lens 102, it acts as an aperture stop, allowing only the collimated portion of the light beam to pass through. Thus, the pinhole drastically reduces any scattered light in the system. Relay lens 108 collects the light from the pinhole and provides it to spectrophotometer 110.

Furthermore, since the pinhole is located at the image plane of the optical imaging system (lenses 100 and 102), only that portion of the light, reflected from the surface of wafer 25, which is the size of the pinhole divided by the magnification, will come through the pinhole. Relay lens 118 collects the light and focuses it onto the CCD camera 114.

The pinhole serves to locate the measurement spot in the image of the wafer 25. Since the pinhole allows light to pass through it, rather than being reflected toward the CCD camera 114, the pinhole appears as a sharp dark point in the image produced by the lens 118. Thus, when viewing the CCD image, the location of the measurement spot is immediately known, it being the location of the dark spot.

Figure 10:
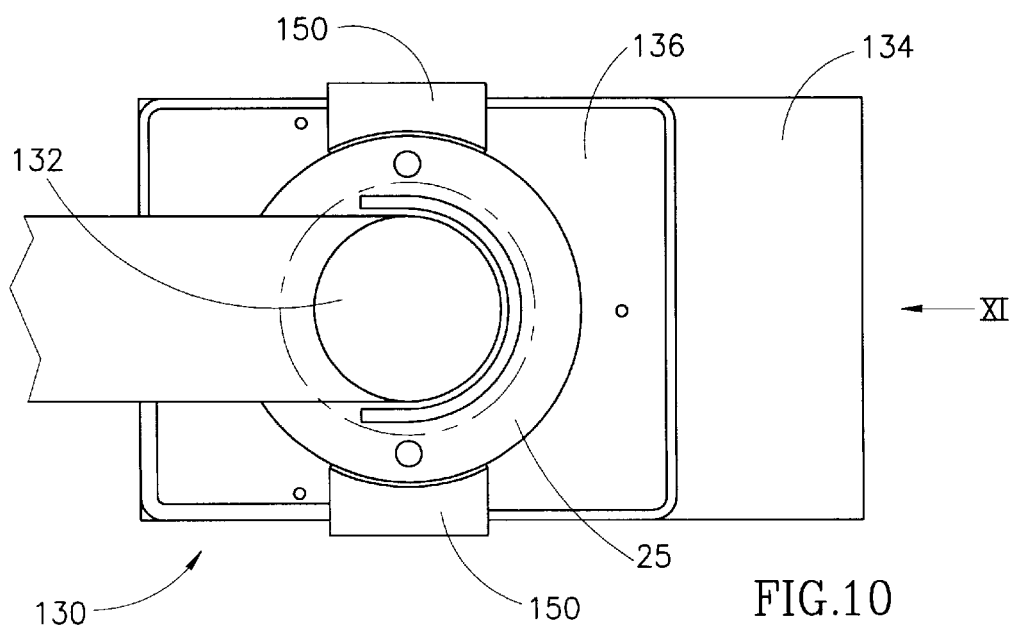
FIG. 10 is a top view of a second embodiment of the measurement system of the present invention.
Figure 11:
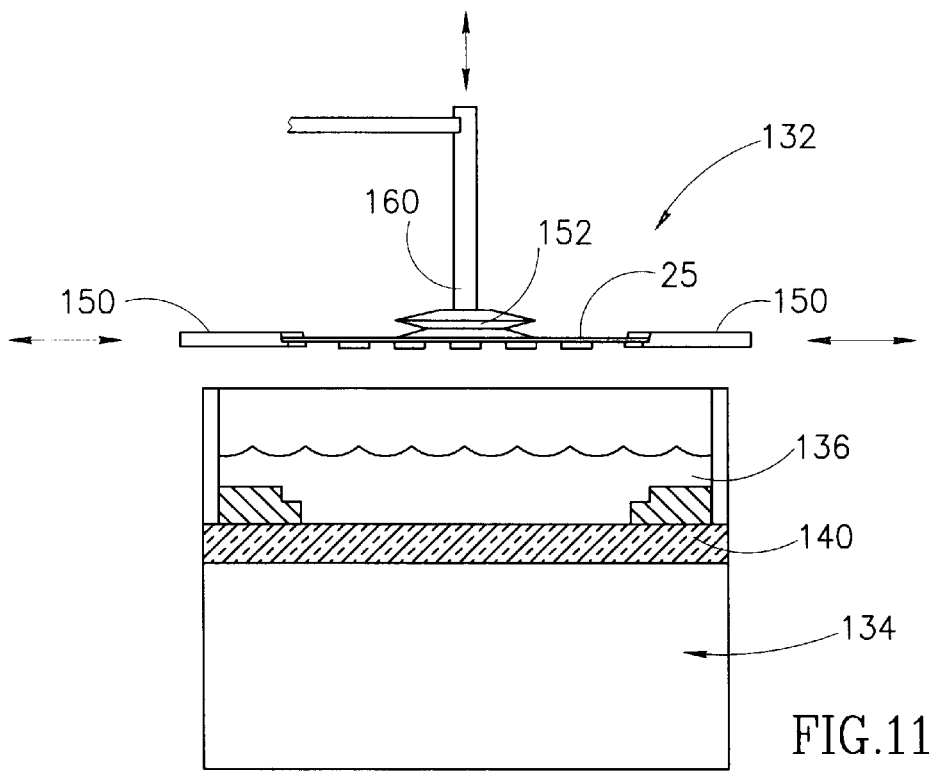
FIGS. 11, 12 and 13 are side views of the measurement system during receipt, transfer and measurement of the wafer, respectively.
Figure 12:
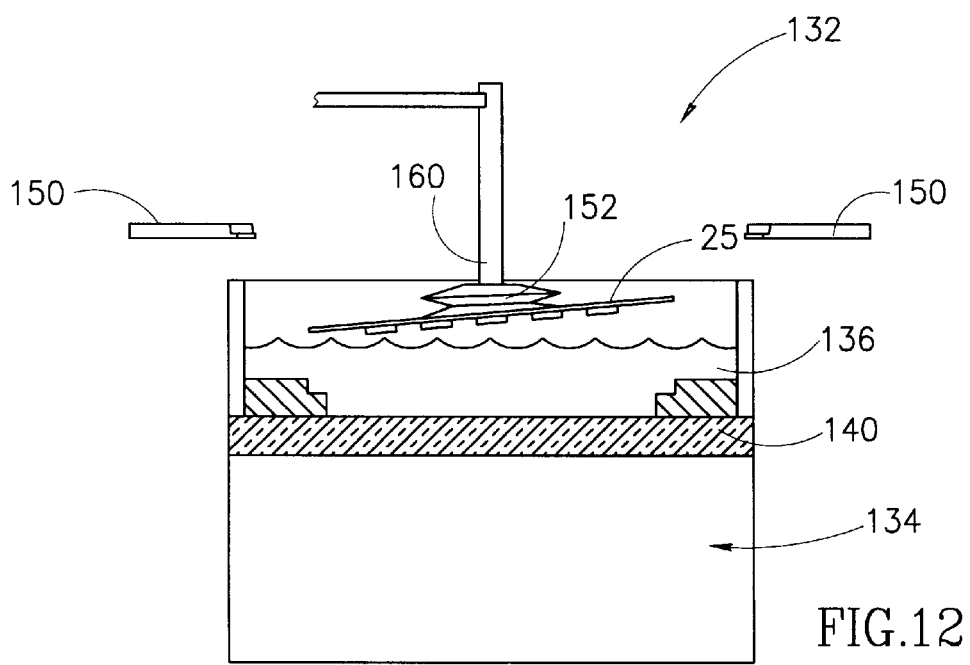
Figure 13:
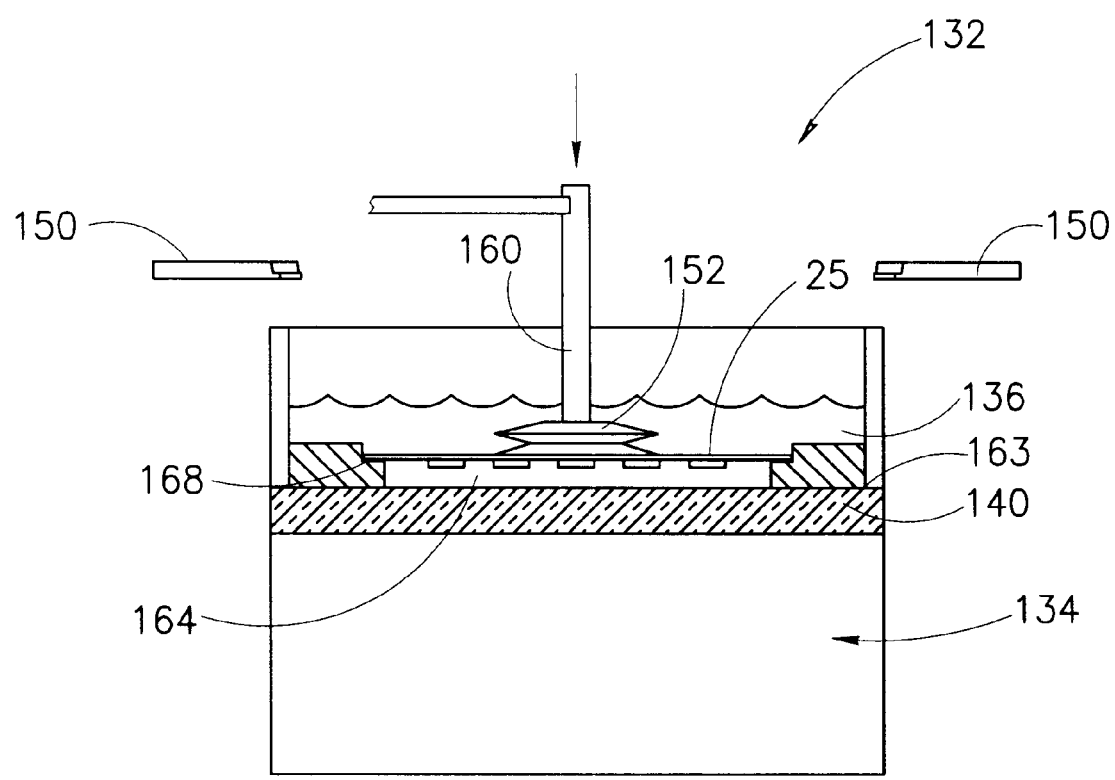

Reference is now made to FIGS. 10–13 which illustrate the thickness measuring of the present invention implemented in a polishing machine similar to that produced by Strasbaugh which has no water track. In this embodiment, the polishing machine or an external robot (not shown) brings the wafers 25 to an exit station of the polisher. When the measurement has finished, the robot brings the wafers 25 to their cassette at another exit station. FIG. 10 is a top view and FIGS. 11, 12 and 13 illustrate the measuring station in three states.

The measuring station 130 comprises a gripping unit 132, an optical system 134 and a water bath 136 (also referred to as a liquid holding unit). The optical system 134 is located beneath the water bath 136 and can be any suitable optical system, such as the one described hereinabove. As in the previous embodiment, the water bath 136 has a window in its bottom surface, labeled 140 in FIG. 11, through which the optical system 134 can illuminate the wafer 25.

The gripping unit 132 comprises a wafer support 150, illustrated as being formed of two support elements, a vacuum pad 152, similar to vacuum pad 44, and a piston 160. The polisher places the wafer 25 on the wafer support 150 while the vacuum pad 152 is initially in a position above the support 150, as shown in FIG. 11. Once the wafer support 150 has the wafer in a predefined position, the vacuum pad 152, which is controlled by piston 160, moves toward the wafer and grabs it by applying a vacuum. Now that the vacuum pad 152 is holding the wafer, the wafer supports 150 move away, as indicated.

The piston 160 then pushes the vacuum pad-wafer combination toward the water bath 136. This is shown in FIG. 12 which also illustrates that the vacuum pad 152 holds the wafer 25 at a small angle $\alpha$ to the horizontal. The angle $\alpha$ is provided since, as in the previous embodiment, the axis of symmetry of the vacuum pad 152 is formed at a small angle $\alpha$ from the vertical axis. As in the previous embodiment, by immersing the wafer 25 into the water at the angle $\alpha$, few, if any, bubbles, remain on the undersurface of the wafer after full immersion.

FIG. 13 illustrates the wafer 25 at its fully immersed, measurement position. Typically, wafer 25 does not directly touch the water surface 163 of the window 140; instead, it sits on a measurement support 168. The result is that there is a water layer 164 between the wafer 25 and the surface 163 of the window.

Once the measurement process has finished, the piston 160 returns the wafer 25 to its original position and the wafer support elements 150 return to their wafer receiving position. The piston 160 places the wafer 25 on the wafer support elements 150 and releases the vacuum. The external robot can now take the wafer to another exit station where there is a cassette of processed and measured wafers.

The present invention also provides an embodiment for increasing the throughput of the measurement system. The embodiment includes a buffer station, described hereinbelow with reference to FIG. 14, which has a high buffer capacity that enables the external handling robot and measuring station, both mentioned hereinabove, to be operated independently of each other. Thus, the robot operation becomes less dependent or even independent of the operation of the measuring station, generally resulting in increased throughput.

In addition, in certain kinds of wafer processing techniques, it is essential that an article such as a semiconductor wafer remains 100% wet upon removal from the wet environment. In some polishing systems, the wafer may be kept out of a wet environment for only a very short time after being polished. There is thus a need, in such systems, for maintaining the wafer wet before further processing such as monitoring (e.g. measuring or inspecting).

Figure 14A:
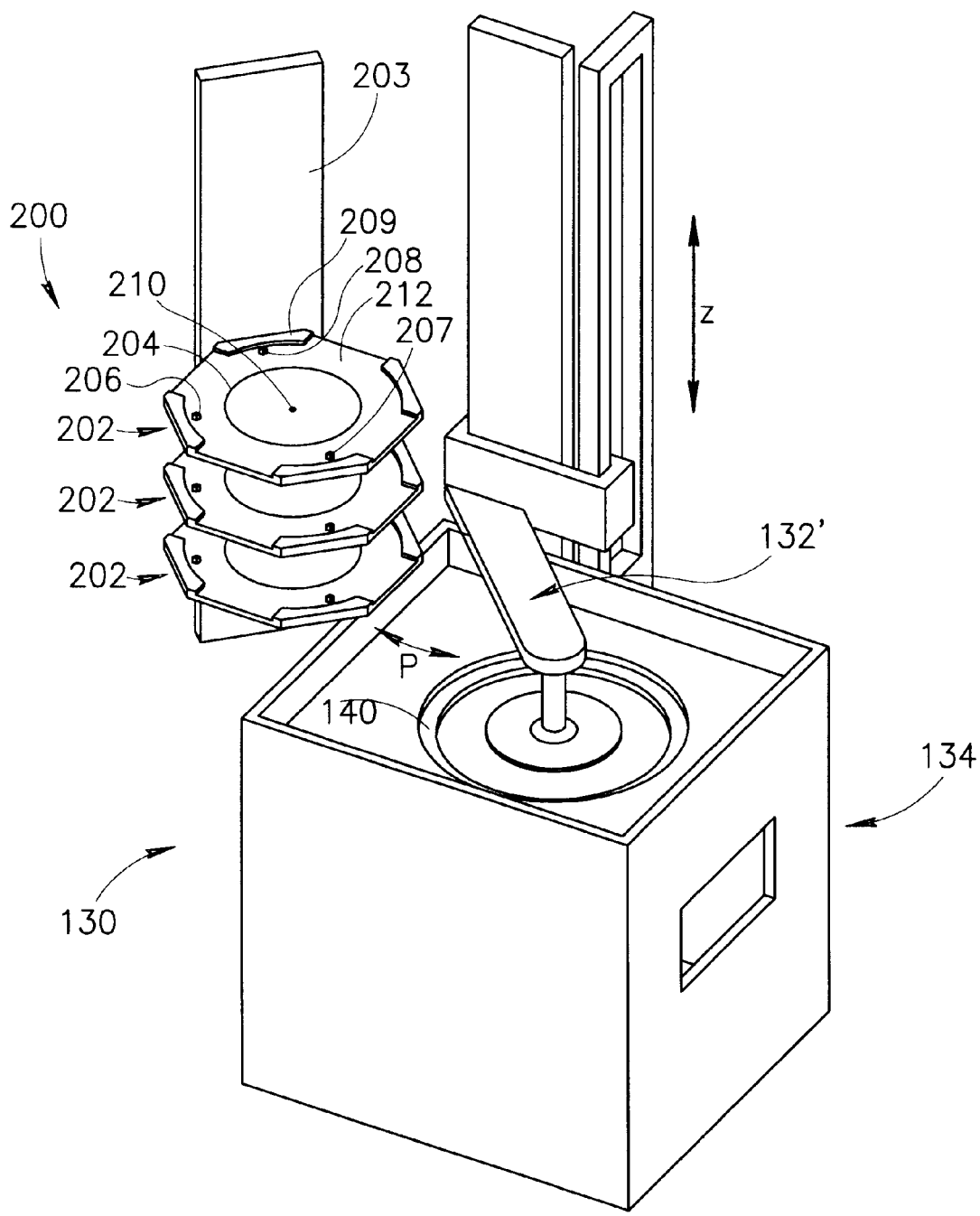
FIGS. 14A and 14B are simplified pictorial illustrations of a buffer station constructed and operative in accordance with preferred embodiments of the present invention, and useful with the measurement systems of the present invention.

Accordingly, the present invention provides a buffer station 200 useful with the measurement system of the present invention, and which is now described with reference to FIG. 14A. FIG. 14A illustrates buffer station 200 incorporated with the monitoring (e.g. measuring or inspecting) station 130, gripping unit 132' and optical unit or system 134 described hereinabove. However, it is understood that buffer station 200 may be used with any of the other embodiments of the present invention described hereinabove.

Figure 15:
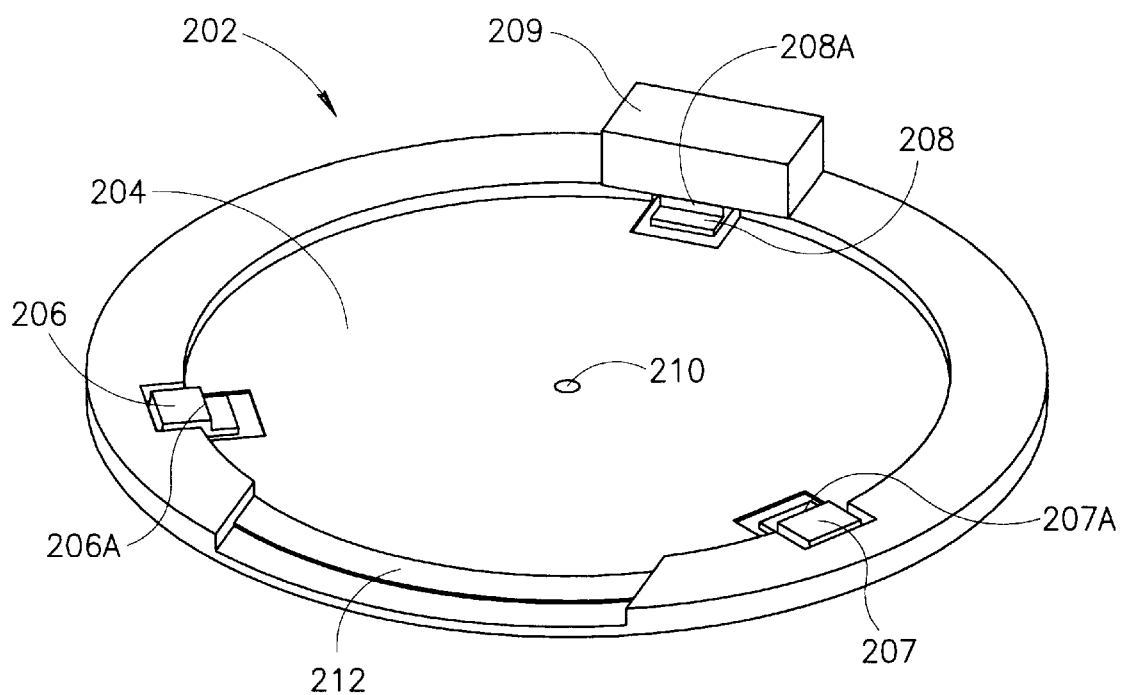
FIG. 15 is a simplified pictorial illustration of a supporting assembly for maintaining objects wet in a buffer station, constructed and operative in accordance with a preferred embodiment of the present invention

Buffer station 200 is preferably static, that is, stationary. Buffer station 200 preferably includes a plurality of stationary supporting assemblies 202 for maintaining objects wet. Supporting assemblies 202 are preferably stacked one above the other on a holding assembly 203. As further shown on FIG. 15, each supporting assembly 202 preferably includes a liquid receptacle 204 of a generally circular tray shape, although any other arbitrary shape is within the scope of the invention (e.g., polygonal, as shown on FIG. 14A). Receptacle 204 includes therein one or more supporting elements, such as three supporting elements 206, 207 and 208, which form together a supporting plane. A wafer may be supported and held on the supporting plane, while being entirely or partially immersed in a liquid, such as purified, e.g. distilled water. The supporting elements may be assembled together with receptacle 204, or may be manufactured as one integral part of receptacle 204.

Stationary supporting assemblies 202 preferably provide the capability of centering the wafer therein. In one preferred embodiment, a relative motion unit (not shown) is located within a sealed cover 209, and is connected to supporting element 208. The relative motion unit may include pneumatic, hydraulic, electric and mechanical drive units, or a combination thereof, and may impart linear, curved or rotational movement, or a combination thereof. Preferably, the supporting surfaces of supporting elements 206, 207 and 208 are slightly inclined towards the center of supporting assembly 202. Supporting elements 206 and 207 are preferably stationary. Supporting elements 206, 207 and 208 are respectively provided with stopping lugs or slopes 206A, 207A and 208A. As the relative motion unit moves supporting element 208 radially inwards (with the wafer abutting against stopping lug or slope 208A), the wafer abuts against the stopping lugs or slopes 206A and 207A of supporting elements 206 and 207 and is centered. It is of course appreciated that the centering operation may be accomplished with other combinations of relative motion of the supporting elements.

A drain valve or shutter 210 is preferably located at the bottom of receptacle 204, and is connected to an appropriate driver (not shown) located within sealed cover 209. Opening drain valve 210 drains liquid from receptacle 204. Preferably, the bottom of receptacle 204 is sloped towards its center in order to provide full drain of liquid therefrom. One or more recesses 212 in the side of receptacle 204 may be provided for draining excessive or overflow liquid to a system sump (not shown).

In operation, gripping unit 132' moves to one of the supporting assemblies 202 and grips a wafer being supported thereat. To this end, gripping unit 132' is linearly movable along vertical axis Z and is mounted for pivotal movement, preferably in a horizontal plane, between supporting assemblies 202 and a measuring location of measuring station 130, as shown by arrow P. While holding the wafer, gripping unit 132' brings the wafer to measuring station 130 for processing as described hereinabove. After processing, the gripping unit 132' picks up the wafer again, and moves the wafer back to one of the supporting assemblies 202 for eventual conveyance to another station. Other wafers are held in the meantime in the other supporting assemblies 202 for eventual processing.

Figure 14B:
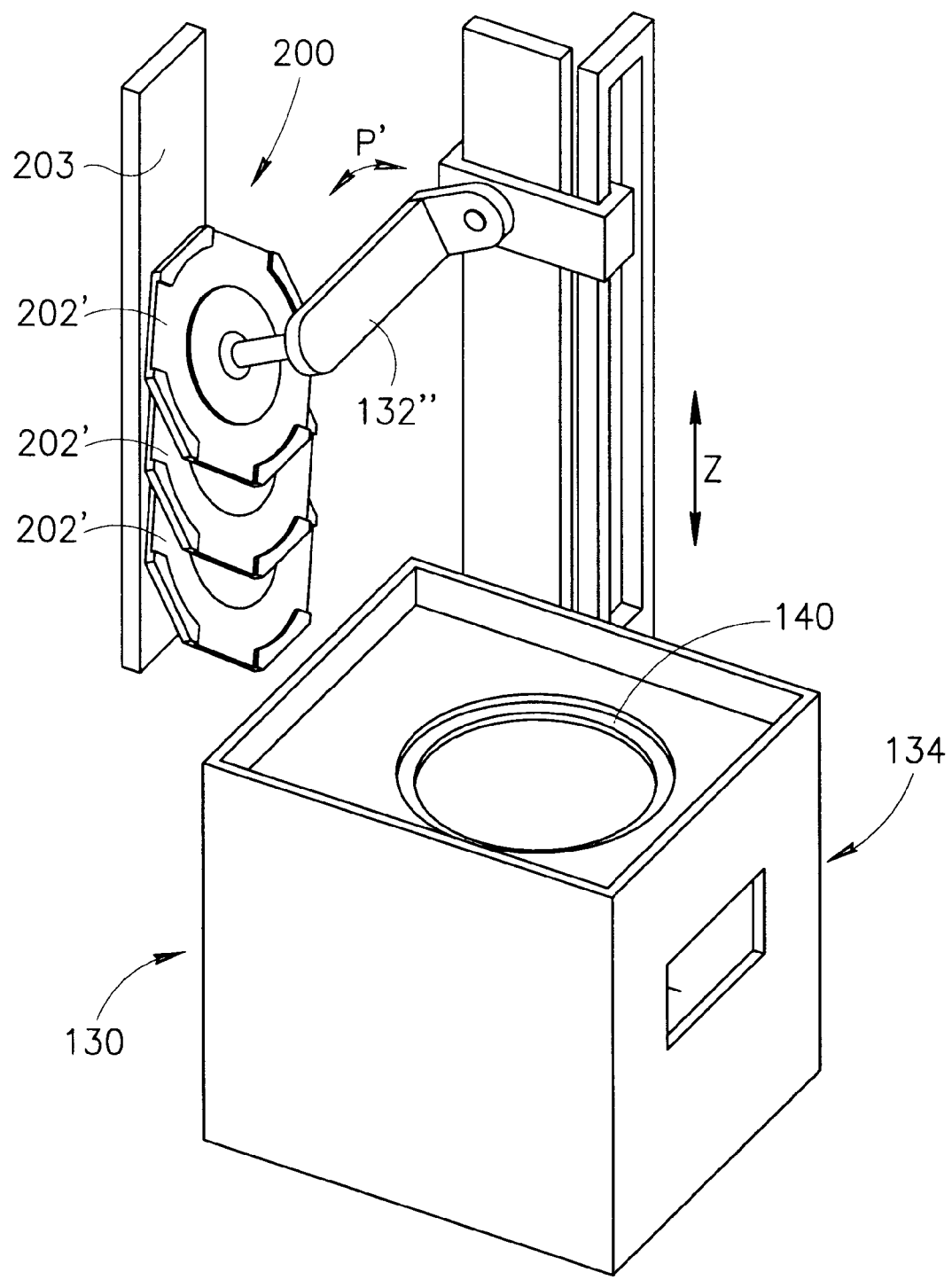

Reference is now made to FIG. 14B which illustrates another alternative embodiment of holding assembly 203 including tilted supporting assemblies 202', D. Such a configuration may be used where there is little floor space available for installation of the buffer station, such as in a clean room environment. In this embodiment, gripping unit 132" is linearly movable along vertical axis Z and is mounted for pivotal movement, preferably in a vertical plane, between supporting assemblies 202' and a measuring location of measuring station 130, as shown by arrow P'. In order to maintain the wafer wet before measuring (or other processing), the wafer may be continuously flushed by purified water flow, which preferably should cover the entire surface of the wafer. Water may be supplied via one or more conduits (not shown) to the top portion of each supporting assembly 202' and further collected in the bottom portion thereof. In order to save water, a closed circulation water supply scheme may be used.

The thickness measuring of the present invention may be implemented as follows. The internal robot of polisher or an external robot (not shown) brings the wafer to one of the supporting assemblies 202 (202') of buffer station 200. Once the supporting assembly 202 (202') has the wafer, the wafer may be centered. Gripping unit 132' (132") moves toward the wafer and grabs it by applying a vacuum. The movements of gripping unit 132' (132") are controlled by the control unit (not shown) in accordance with information regarding the wafer's location within the buffer 200. After that, the wafer is transferred by gripping unit 132' (132") to measuring station 130 and lowered to the measuring location above the window 140. As in the previous embodiment, the wafer is immersed into the water at the angle α and stays entirely immersed while measured. During the measurements, the wafer may sit on a measuring support or/and may be supported by gripping unit 132' (132"). While the measurements are performed, the robot brings another polished wafer from the polisher and puts it on free supporting assembly 202 (202'). Once the measurement process has finished, gripping unit 132' (132") returns the wafer to one of the supporting assemblies 202 (202'). The robot may pick up the measured wafer from one of the supporting assemblies 202 (202') and transfer it to the output cassette of wafers, or if necessary, may return the wafer to the polisher.

In an alternative embodiment of the present invention, another type of wafer orientation, known as pre-alignment, may be performed after picking up the wafer from buffer station 200 and before loading it on the measuring location of measuring station 130, as is now described with reference to FIGS. 16A–16D and FIGS. 17A and 17B.

Figure 16A:
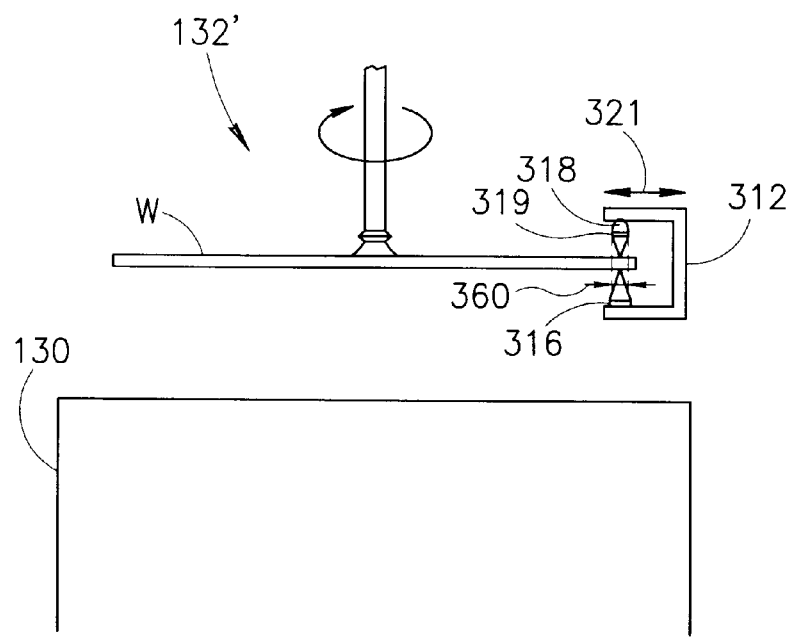
FIGS. 16A and 16B are two schematic illustrations of an alternative embodiment of the buffer station and measurement system of the present invention having a pre-alignment unit, in two different stages of operation.
Figure 16B:
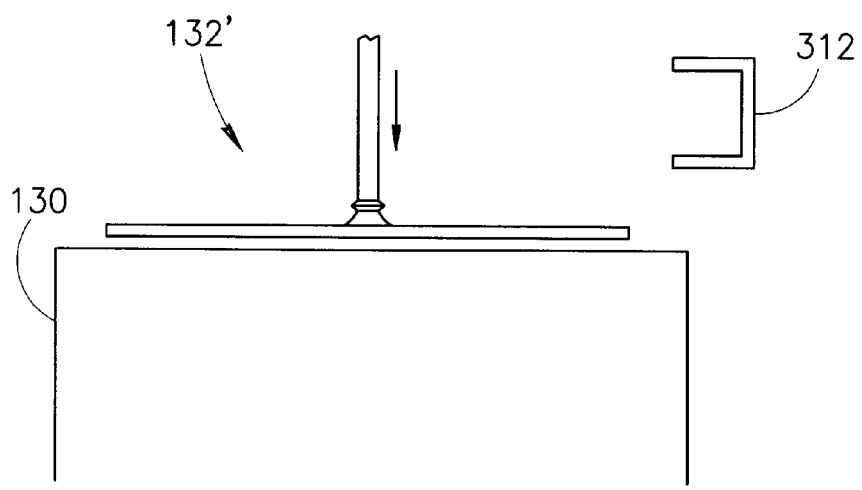
Figure 16C:
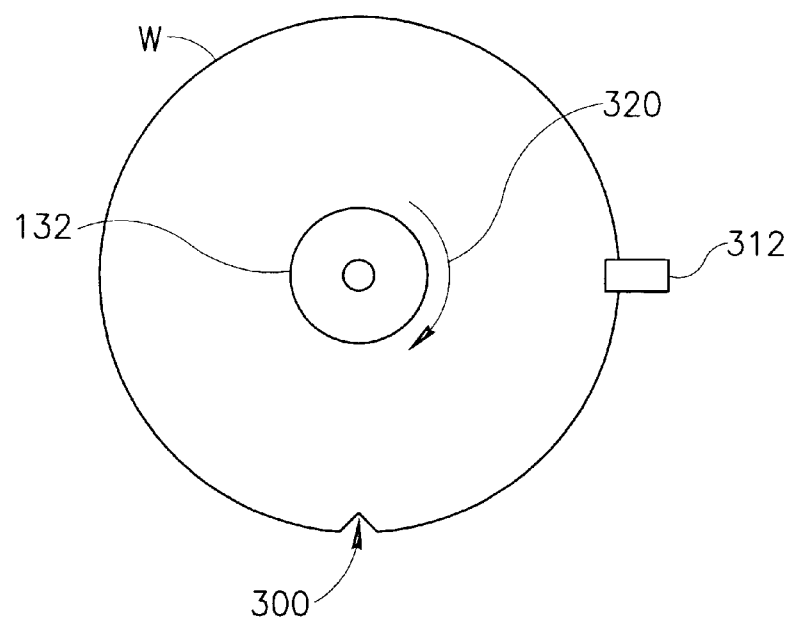
FIGS. 16C and 16D are schematic illustrations of a wafer in various stages of alignment, useful in understanding the operation of the pre-alignment unit of FIGS. 16A and 16B.
Figure 16D:
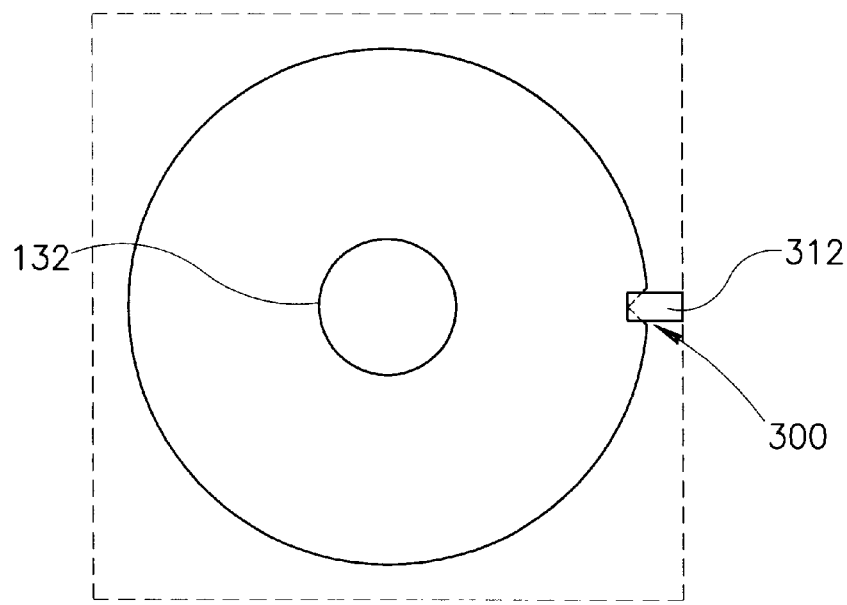
Figure 17A:
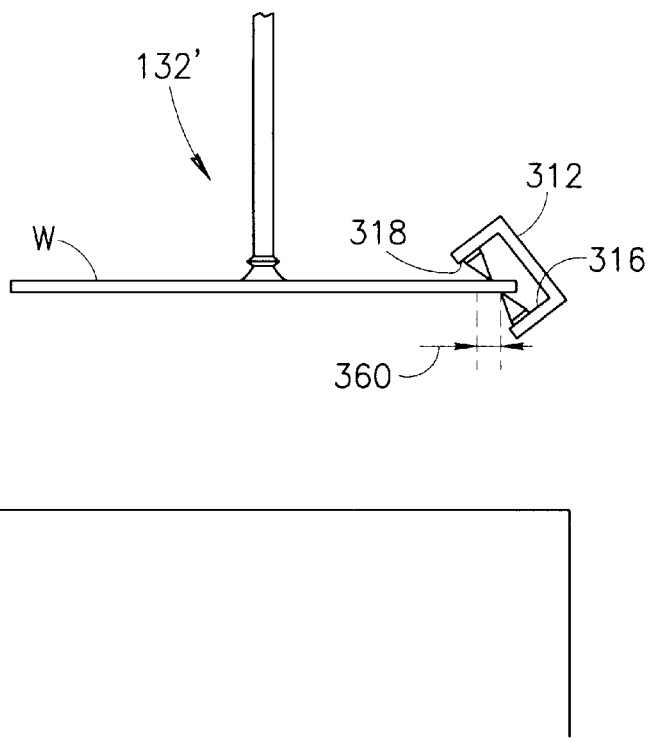
FIGS. 17A and 17B are schematic illustrations of an alternative embodiment of the pre-alignment unit, in two different stages of operation.
Figure 17B:
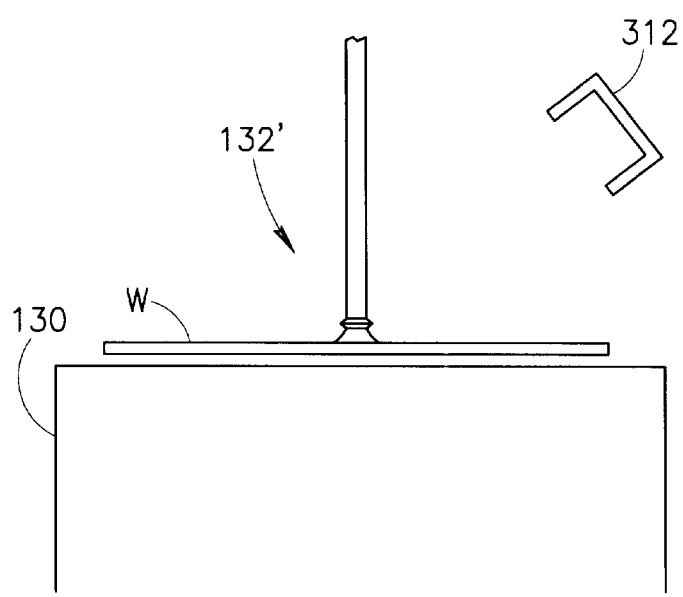

Reference is now made to FIGS. 16A and 16B which illustrate this alternative embodiment in two different states, to FIGS. 16C and 16D which are useful in understanding the operation of the embodiment of FIGS. 16A and 16B and to FIGS. 17A and 17B which provide an alternative embodiment of the pre-alignment unit.

In this embodiment of the present invention, the measurement system and buffer station additionally include a pre-alignment unit 312 located along the path of gripping unit 132. In FIGS. 16A and 16B, pre-alignment unit 312 is located between the buffer station 200 (not shown) and measuring station 130. Pre-alignment unit 312 is similar to that described in U.S. Pat. No. 6,038,029, assigned to the common assignees of the present invention and incorporated herein by reference. Accordingly, the details of operation of pre-alignment unit 312 will not be described herein.

As discussed in U.S. Pat. No. 6,038,029, pre-alignment unit 312 detects the presence of a marker, which is standardly present on wafers. Such a marker can be a flat line (a "flat") crossing a small portion of the edge of the wafer or a notch and are used to define the fiducial axis of the wafer.

In accordance with one embodiment of the present invention, pre-alignment unit 312 is a moveable opto-couple detector, focused on the edge of wafer W, which comprises a point illuminator 316, such as a light emitting diode (LED), a single photodiode 318, a photodiode lens 319 and a translation mechanism, indicated by arrow 321. The translation mechanism holds pre-alignment unit 312 and moves it into and out of its place above the wafer edge.

FIG. 16A shows pre-alignment unit 312 in a first, detecting position, surrounding an edge area 360 of the wafer and FIG. 16B shows pre-alignment unit 312 in a second, non-detecting position away from the path of gripping unit 132.

Gripping unit 132' (132") transfers wafer from one of the supporting assemblies 202 (202') of buffer station 200 and holds wafer W at the height of pre-alignment unit 312. Pre-alignment unit 312 is then brought into the first position shown in FIG. 16A. FIG. 16C illustrates the original, arbitrary orientation of the wafer W. As indicated by arrow 320 in FIG. 16C, gripping unit 132 rotates the wafer W until a marker 300 (e.g., a flat or a notch) passes the pre-alignment unit 312 which then indicates such to the measuring station's control unit (not shown).

Specifically, the point illuminator 316 illuminates the edge area 360 of the one side of wafer W whereas the single photodiode 318 detects signals from the edge area 360 from another side. Whenever the marker is not located between the elements of the pre-alignment unit 312, no light from the point illuminator 316, above a predetermined threshold level, can reach the photodiode 318. However, once the photodiode 318 detects a significant signal, i.e., the marker is between the elements of the pre-alignment 312, the control unit stops the rotation of gripping unit 132' (132"). The wafer W is now in a generally known position, near the pre-alignment unit 312 as shown in FIG. 16D.

The pre-alignment unit 312 is now returned to the side, as shown in FIG. 16B, and, typically, gripping unit 132 brings the now pre-aligned wafer W to measuring station 130.

FIGS. 17A and 17B illustrate another preferred embodiment of the pre-alignment unit 312 which eliminates the need to insert and remove the pre-alignment unit 312 to and from the translation path of gripping unit 132' (132"). Pre-alignment unit 312 is tilted and located in a position above the uppermost position of gripping unit 132. This position is the furthest position from measuring station 130.

Gripping unit 132 first takes the wafer W (generally, an unmeasured wafer) from the one of the supporting assemblies 202 (202') of buffer station 200 and brings it into pre-alignment unit 312. Since pre-alignment unit 312 is tilted such that its lower half is away from the path of gripping unit 132, wafer W does not hit anything during this operation.

When gripping unit 132 is in its uppermost position, point illuminator 316 illuminates the bottom side of the edge area 360 of the wafer W while photodiode 318 detects signals above the edge area 360. When pre-alignment is completed, gripping unit 132' (132") lowers the wafer, away from pre-alignment unit 312 to measuring station 130, as shown in FIG. 17B. Once again, since pre-alignment unit 312 is tilted, gripping unit 132' (132") can move wafer W into and out of unit 312 without unit 312 having to move.

It will be appreciated by persons skilled in the art that the present invention is not limited by what has been particularly shown and described herein above. Rather the scope of the invention is defined by the claims that follow:

What is claimed is:

1. A monitoring tool for monitoring an article in a wet environment, said monitoring tool comprising:
    a monitoring station having an optical unit, a liquid holding unit for receiving said article, and a window, through which at least a portion of said article is viewable by said optical unit;
    a buffer station associated with said monitoring station having a plurality of supporting assemblies for receiving said article before and after being monitored, wherein at least one of the supporting assemblies comprises a liquid receptacle for holding the article therein; and
    a gripping unit operating in conjunction with said monitoring station for moving said article from said buffer station to said liquid holding unit of said monitoring station.

2. The monitoring tool according to claim 1 wherein at least one of said supporting assemblies further comprises a plurality of supporting elements.

3. The monitoring tool according to claim 2 and wherein said plurality of supporting elements includes three supporting elements.

4. The monitoring tool according to claim 2, wherein at least one of said supporting elements is movable and is adapted to center the article.

5. The monitoring tool according to claim 1 wherein said liquid holding unit has a bottom surface and at least a portion of said bottom surface is formed by the window, through which at least a portion of said article is viewable.

6. The monitoring tool according to claim 1 and also including an optical pre-alignment unit.

7. The monitoring tool according to claim 6 wherein said pre-alignment unit is movable.

8. The monitoring tool according to claim 7 wherein said pre-alignment unit is tilted with respect to a vertical path of said gripping unit.

9. The monitoring tool according to claim 1 wherein said supporting assemblies are tilted.

10. The monitoring tool according to claim 1 wherein said gripping unit is mounted for linear movement along a vertical axis and pivotal movement between said supporting assemblies and said monitoring station.

11. The monitoring tool according to claim 10 wherein said gripper is mounted for pivotal movement in a horizontal plane between said supporting assemblies and said monitoring station.

12. The monitoring tool according to claim 10 wherein said gripping unit is mounted for linear movement along a vertical axis and pivotal movement between said supporting assemblies and said monitoring station.

13. The monitoring tool according to claim 9 wherein said gripper is mounted for pivotal movement in a vertical plane between said supporting assemblies and said monitoring station.

14. The monitoring tool according to claim 1 wherein said article is a semiconductor wafer.

15. The monitoring tool according to claim 14 wherein the monitoring station is an optical metrology station.

16. The monitoring tool according to claim 14 wherein the monitoring station is an optical inspection station.

17. The monitoring tool according to claim 15 wherein said optical metrology station includes an optical thickness measuring unit.

18. The monitoring tool according to claim 17 wherein said optical thickness measuring unit comprises a spectrophotometer.

19. The monitoring tool according to claim 18 wherein said optical thickness measuring unit further comprises:
    an illumination optical unit for directing light towards said wafer;
    an imaging unit for imaging at least a top layer of said wafer;
    a spectrophotometric detector; and
    an optical assembly in operative communication with said imaging unit and said spectrophotometric detector for providing light reflected from said wafer separately to said imaging unit and to said spectrophotometric detector, said optical assembly comprising an objective lens, a pinhole mirror and first and second relay lenses, wherein said first relay lens focuses the light passing through said pinhole mirror onto said spectrophotometric detector and wherein said second relay lens focuses the light reflected from said pinhole mirror onto said imaging unit.

20. A wafer polishing apparatus comprising:
    a polishing unit for polishing a top layer of a wafer in the presence of a liquid;
    a monitoring tool in communication with said polishing unit; and
    a transferring unit for transferring said wafer from said polishing unit to said monitoring tool, while said wafer is still wet;
    said monitoring tool comprising;
        a monitoring station having an optical unit, a liquid holding unit for receiving said article, and a window, through which at least a portion of said article is viewable by said optical unit;
        a buffer station associated with said monitoring station having a plurality of supporting assemblies for receiving said article before and after being monitored, wherein at least one of the supporting assemblies comprises a liquid receptacle for holding the article therein; and
        a gripping unit operating in conjunction with said monitoring station for moving said article from said buffer station to said liquid holding unit of said monitoring station.

21. The apparatus according to claim 20 wherein said monitoring tool comprising an optical thickness measuring unit.

22. The apparatus according to claim 21, wherein said optical thickness measuring unit comprises:
- an illumination optical unit for directing light towards said wafer;
- an imaging unit for imaging at least said top layer of said wafer;
- a spectrophotometric detector; and
  - an optical assembly in operative communication with said imaging unit and said spectrophotometric detector for providing light reflected from said wafer separately to said imaging unit and to said spectrophotometric detector, said optical assembly comprising an objective lens, a pinhole mirror and first and second relay lenses, wherein said first relay lens focuses the light passing through said pinhole mirror onto said spectrophotometric detector and wherein said second relay lens focuses the light reflected from said pinhole mirror onto said imaging unit.

23. The apparatus according to claim 21 wherein the supporting assemblies are tilted.

* * * * *